(12) United States Patent
Sdrulla et al.

(10) Patent No.: US 10,811,494 B2
(45) Date of Patent: Oct. 20, 2020

(54) METHOD AND ASSEMBLY FOR MITIGATING SHORT CHANNEL EFFECTS IN SILICON CARBIDE MOSFET DEVICES

(71) Applicant: MICROSEMI CORPORATION, Aliso Viejo, CA (US)

(72) Inventors: Dumitru Gheorge Sdrulla, Bend, OR (US); Avinash Srikrishnan Kashyap, Portland, OR (US)

(73) Assignee: Microsemi Corporation, Chandler, AZ (US)

( * ) Notice: Subject to any disclaimer, the term of this patent is extended or adjusted under 35 U.S.C. 154(b) by 0 days.

(21) Appl. No.: 16/181,051

(22) Filed: Nov. 5, 2018

(65) Prior Publication Data

US 2019/0140047 A1    May 9, 2019

Related U.S. Application Data

(60) Provisional application No. 62/582,483, filed on Nov. 7, 2017.

(51) Int. Cl.
*H01L 29/15* (2006.01)
*H01L 31/0312* (2006.01)
(Continued)

(52) U.S. Cl.
CPC ...... *H01L 29/0626* (2013.01); *H01L 29/1095* (2013.01); *H01L 29/41741* (2013.01);
(Continued)

(58) Field of Classification Search
USPC ............................. 257/77, 394, 351; 438/138
See application file for complete search history.

(56) References Cited

U.S. PATENT DOCUMENTS 7,547,578 B2    6/2009   Agarwal et al.
8,216,929 B2    7/2012   Kawai et al.
(Continued)

FOREIGN PATENT DOCUMENTS

EP    1058303 A1    12/2000
EP    2083449 A3     9/2009

OTHER PUBLICATIONS

F. Mazzamuto et al., "Low Thermal Budget Ohmic Contact Formation by Laser Anneal", Materials Science Forum, vol. 858, pp. 565-568, 2016., Jan. 1, 2016.
(Continued)

*Primary Examiner* — Niki H Nguyen
(74) *Attorney, Agent, or Firm* — Glass and Associates; Kenneth Glass

(57) ABSTRACT

A power transistor assembly and method of mitigating short channel effects in a power transistor assembly are provided. The power transistor assembly includes a first layer of semiconductor material formed of a first conductivity type material and a hard mask layer covering at least a portion of the first layer and having a window therethrough exposing a surface of the first layer. The power transistor assembly also includes a first region formed in the first layer of semiconductor material of a second conductivity type material and aligned with the window, one or more source regions formed of first conductivity type material within the first region and separated by a portion of the first region, and an extension of the first region extending laterally through the surface of the first layer.

15 Claims, 4 Drawing Sheets

(51) Int. Cl.
  *H01L 29/06* (2006.01)
  *H01L 29/78* (2006.01)
  *H01L 29/66* (2006.01)
  *H01L 29/417* (2006.01)
  *H01L 29/10* (2006.01)
  *H01L 29/16* (2006.01)

(52) U.S. Cl.
  CPC .. *H01L 29/66712* (2013.01); *H01L 29/66719* (2013.01); *H01L 29/7802* (2013.01); *H01L 29/1608* (2013.01)

(56) References Cited

U.S. PATENT DOCUMENTS

| | | |
|---|---|---|
| 8,440,524 B2 | 5/2013 | Fujiwara et al. |
| 8,941,122 B2 | 1/2015 | Kawai et al. |
| 8,962,468 B1 | 2/2015 | Hostetler |
| 9,105,558 B2 | 8/2015 | Kawai et al. |
| 9,263,267 B2 | 2/2016 | Kawai et al. |
| 9,384,981 B2 | 7/2016 | Tamaso et al. |
| 2003/0059983 A1 | 3/2003 | Ota et al. |
| 2010/0163888 A1 | 7/2010 | Saggio et al. |
| 2010/0327358 A1* | 12/2010 | Kronholz ............ H01L 27/1207 257/350 |
| 2011/0284957 A1* | 11/2011 | Tamaki ............. H01L 29/66727 257/339 |
| 2012/0049902 A1 | 3/2012 | Corona et al. |
| 2013/0009256 A1 | 1/2013 | Okumura et al. |
| 2015/0333190 A1* | 11/2015 | Aketa ................. H01L 29/0661 257/77 |

OTHER PUBLICATIONS

Rupp, et al., "Laser backside contact annealing of SiC Power devices: A Prerequisite for SiC thin wafer technology", Proceedings of the 25th International Symposium on Power Semiconductor Devices & ICs, Kanazawa, 2013.

Scarpa, et al., "New Sic Thin-Wafer Technology Paving the Way of Schottky Diodes with Improved Performance and Reliability", Infineon Technologies Siemenstrasse 2, 9500 Villach, Austria, date unknown.

PCT/US2018/059243, International Search Report and Written Opinion, Jan. 21, 2019.

* cited by examiner

METHOD AND ASSEMBLY FOR MITIGATING SHORT CHANNEL EFFECTS IN SILICON CARBIDE MOSFET DEVICES

CROSS REFERENCE TO RELATED APPLICATION

This application claims priority to and the benefit of U.S. Provisional Application No. 62/582,438 filed Nov. 7, 2017, which is incorporated by reference herein in its entirety.

BACKGROUND

This description relates to semiconductor devices and fabrication of semiconductor devices, and more specifically to a vertical, double implanted, Metal Oxide Semiconductor Field Effect Transistor (MOSFET) devices on silicon carbide (SiC), and methods of fabricating them.

Silicon Carbide (SiC) is a wide-band gap (WBG) semiconductor material that has material properties that make it suitable for high voltage, high power semiconductor devices. However, SiC also exhibits an undesirable lack of diffusion of any implanted species. This limitation means that all implanted layers are shallow relative to the surface of the semiconductor material, and therefore all junction depths are limited to the capability of the ion implantation equipment (typically in the range of 1.0-2.0 µm). Due to constraints related to the need to place the source implant "self aligned" to the hard mask that creates the body layer, and due to the desire to have a MOSFET with a low "drain-source on resistance" (RDS(on)), the channel length of a Vertical, Double Implanted Metal Oxide Semiconductor (VDIMOS) is shorter than desirable. When the channel of a MOS devices approaches the width of the depletion layer in the P-body under high reverse voltages between a drain and a source, the drain current of the MOSFET exhibits a "short channel" effect, which is manifested by a high leakage current close to the avalanche voltage. One feature of this abnormal leakage current is that it can be totally eliminated with a negative bias on the gate, which has the effect of electronically increasing the effective length of the channel. Because of a threshold voltage dependence on temperature characteristic, the "short channel" effect is even more pronounced at elevated ambient and operating temperatures, when the voltage required to create an inversion layer in the P-Well is lowered. Short channel effects, also referred to as, drain induced barrier lowering (DIBL) or punch through, can affect the long term reliability of the MOSFET due to local temperature increase and increased injection rate of hot carriers in the gate oxide.

For example, in a classic MOSFET with a "long channel," the gate voltage required to form an inversion layer in the body is entirely independent on the drain voltage. In the case of a Drain Induced Barrier Lowering (DIBL) the depletion region in the body has the effect of lowering the potential energy barrier for the electrons. The gate voltage has the function of lowering the potential barrier down to the point where electrons are able to flow. As the channel becomes shorter, a larger drain voltage (V D) widens the depletion region in the body to a point that reduces the potential barrier, allowing electrons to flow between the source and drain.

SUMMARY

In one embodiment, a power transistor assembly includes a first layer of semiconductor material formed of a first conductivity type material and a hard mask layer covering at least a portion of the first layer and having a window therethrough exposing a surface of the first layer. The power transistor assembly also includes a first region formed in the first layer of semiconductor material of a second conductivity type material and aligned with the window, one or more source regions formed of first conductivity type material within the first region and separated by a portion of the first region, and an extension of the first region extending laterally through the surface of the first layer.

In another embodiment, a method of mitigating short channel effects in a power transistor assembly includes using a polysilicon layer as the hard mask to block the implants, over a first surface of a substrate formed of a silicon carbide material, the polysilicon layer having an outer surface and an inner surface relative to the substrate, and a face extending between the inner surface and the outer surface, a distance between the inner surface and outer surface defining a thickness of the polysilicon layer. The method also includes opening a window through the-polysilicon layer to the first surface of the substrate and implanting impurities in the first surface of the substrate to form a body region perfectly aligned with the window. The method further includes forming a source region in the body region, growing an oxide on the polysilicon layer, etching away the oxide, and implanting additional impurities into the first surface of the substrate proximate the etched oxidized face forming a lateral extension of the body region extending away from the source region to create a longer channel of the power transistor assembly.

In yet another embodiment, a power semiconductor assembly includes a semiconductor substrate formed of an N-type material and having a first impurity concentration and a P-well formed on a first surface of the semiconductor substrate and having a second impurity concentration, the second impurity concentration greater than the first impurity concentration of the semiconductor substrate. The power semiconductor assembly also includes an N-type source region formed on the first surface of the semiconductor substrate in the P-well and having a third impurity concentration that is greater than the first impurity concentration, at least one P-type extension region formed in the first surface of the semiconductor substrate and extending laterally away from the N-type source region, and a gate insulating film formed on the first surface of the semiconductor substrate between the N-type source regions.

BRIEF DESCRIPTION OF THE DRAWINGS

FIGS. 1-4 illustrate a sequence of forming a vertical, double implanted, Metal Oxide Semiconductor Field Effect Transistor (MOSFET) in accordance with an example embodiment of the present disclosure.

FIGS. 5-8 illustrate a sequence of forming a vertical, double implanted, Metal Oxide Semiconductor Field Effect Transistor (MOSFET) in accordance with another example embodiment of the present disclosure.

FIG. 9 is a cross-sectional view of a process of forming a power transistor assembly having a plurality of channel extensions.

FIG. 10 is a flowchart of a method of mitigating short channel effects in a power transistor assembly in accordance with an example embodiment of the present disclosure.

Figure 1:
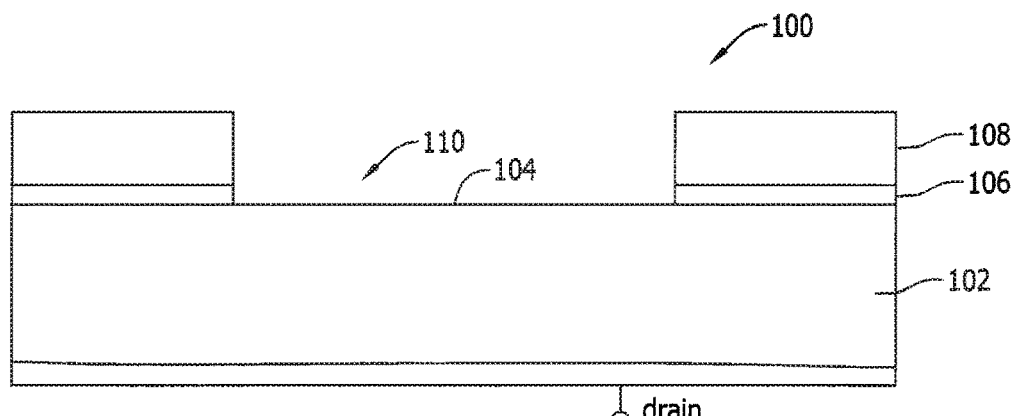
FIGS. 1-10 show example embodiments of the method and apparatus described herein.
Figure 2:
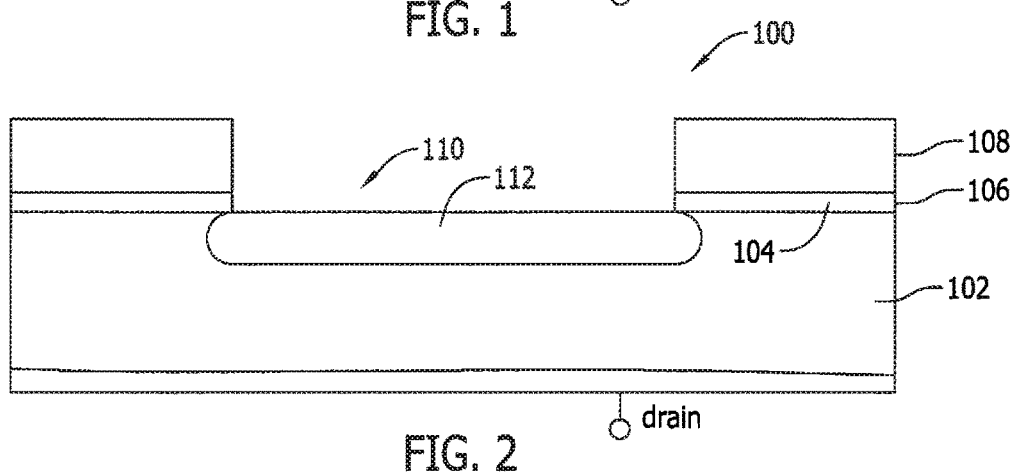
Figure 3:
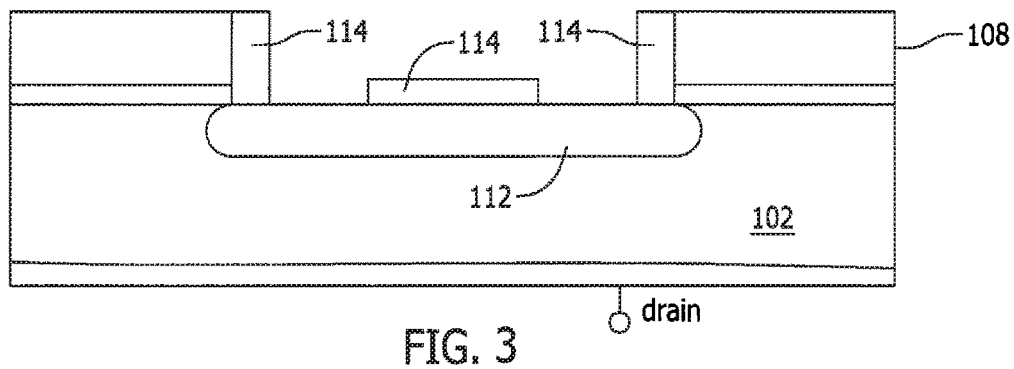

Although specific features of various embodiments may be shown in some drawings and not in others, this is for convenience only. Any feature of any drawing may be referenced and/or claimed in combination with any feature of any other drawing.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION OF THE EMBODIMENTS

The following detailed description illustrates embodiments of the disclosure by way of example and not by way of limitation. It is contemplated that the disclosure has general application to silicon carbide semiconductor devices in a plurality of different applications.

Embodiments of a vertical double implanted metal oxide semiconductor (VDMOS) device are described herein. The VDMOS device incorporates a double implantation fabrication process where a p-type doped region and an n+ type source region are implanted through a common window defined by an edge of a hard mask (polysilicon) of the device. In accordance with some embodiments, the hard mask layer includes a metal or metals, which may be in the form of a metal nitride, for example, titanium nitride. Hard mask layer may also be formed of a non-metal nitride such as silicon nitride, an oxynitride such as silicon oxynitride, or the like. The p-region is implanted deeper than the n+ source and the surface channel length is defined as the lateral implantation distance between the p− and the n+ source. In an n-type enhancement MOSFET, for example, a positive bias on the gate causes a surface inversion layer—or channel—to form in a p-type region under the gate oxide and thereby creates a conductive path between source and drain. The application of a positive drain voltage then produces current flow between drain and source. Electrons enter the source terminal and flow laterally through the inversion layer under the gate to the n-drift region, the electrons then flow vertically through the n-drift region to the drain terminal.

In one embodiment, a power transistor assembly includes a first layer of semiconductor material formed of a first conductivity type material such as, an epitaxially formed substrate of silicon carbide (SiC) with a hard mask layer of for example, a polysilicon material covering at least a portion of the first layer and having a window therethrough exposing a surface of the first layer. In some embodiments, a thin oxide layer is formed on the first layer of semiconductor material before the hard mask layer is formed. A first region is formed in the first layer of semiconductor material of a second conductivity type material and closely aligned with the window. The one or more source regions form a pn junction with the first region. One or more source regions formed of first conductivity type material within the first region and separated by a portion of the first region. An extension of the first region is formed to extend laterally through the surface of the first layer. The extension may include one or more serial extensions formed separately from each other of the one or more serial extensions. The extensions of the first region serve to lengthen the channel and to reduce short channel effects. The first region cannot simply be lengthened to accomplish the same end. If the first region (P-well) were simply extended, which would accomplish approximately the same outcome as forming the first region as a longer body originally except, this would have a negative effect by pinching the JFET region. To avoid pinching, in the example embodiment, the first region extends into the first layer to a depth of greater than 1.0 microns. In other embodiments, the first region extends into the first layer to a depth of approximately 0.75 microns to approximately 1.25 microns. In the example embodiment, the one or more serial extensions extend into first layer to a depth of approximately 50% of the depth of the first region. In other embodiments, the one or more serial extensions extend into first layer to a depth of approximately 0.2 microns to approximately 0.5 microns. The shallower extension facilitates mitigating the effects of the short channel without the pinching phenomenon.

In various embodiments, a drain region formed on a side of the first layer opposite the one or more source regions.

A method of mitigating short channel effects in a power transistor assembly includes forming a hard mask layer of for example, a polysilicon material, over a first surface of a substrate formed of a first conductivity type silicon carbide material. The hard mask layer has an outer surface and an inner surface relative to the substrate, and a face extending between the inner surface and the outer surface. A distance between the inner surface and outer surface defining a thickness of the hard mask layer. The method includes opening a window through the hard mask layer to the first surface of the substrate, implanting impurities in the first surface of the substrate to form a body region approximately aligned with the window, and forming a source region in the body region having the first conductivity type silicon carbide material. The method further includes oxidizing the face of the hard mask layer, etching away the oxidized face of the hard mask layer, and implanting additional impurities into the first surface of the substrate proximate the etched oxidized face forming a lateral extension of the body region extending away from the source region in a direction of the layer. The face of the hard mask layer may be repeatedly oxidized, etched, and additional impurities implanted into the first surface of the substrate to form additional lateral extensions of the body region extending away from the source region in a direction of the hard mask layer. A drain region may be formed on a second surface of the substrate opposite the polysilicon layer.

The present embodiments are described in full detail, with reference to the cross sections and accompanying drawings and with emphasis on the methods to implement the main embodiments. In the cross sections and the drawings the thicknesses of various layers are not to scale but rather drawn with the intention to illustrate the scope of this disclosure.

It is also evident to the person familiar with this field that a real power MOSFET is constructed by repeating cells of the same layout and vertical composition of the layers as illustrated in the cross sections and drawings. The cells can be, for example, an array of stripes or a hexagonal honeycomb in plan view.

It is also apparent to the skilled person that this disclosure is applicable to P-channel and N-channel Power MOSFET and Power IGBTs formed of SiC material.

FIGS. 1-4 illustrate a sequence of forming a vertical, double implanted, Metal Oxide Semiconductor Field Effect Transistor (MOSFET) 100 in accordance with an example embodiment of the present disclosure. In the example embodiment, MOSFET 100 is formed of a wide-band gap (WBG) semiconductor material, such as, but not limited to Silicon Carbide (SiC). As used herein, WBG materials include semiconductors that have bandgaps on the order of 2 to 4 eV. The electronic properties of WBG semiconductors permit devices formed of WBG semiconductors to operate at relatively higher voltages, frequencies and temperatures than conventional semiconductor materials. WBG semiconductors can be operated at temperatures greater than 300° C. The high temperature tolerance also permits WBG semiconductors to be operated at relatively higher power levels under normal conditions. WBG semiconductors also have a relatively higher critical electrical field density, which may be approximately ten times that of conventional semiconductors. Most wide-bandgap materials also have high free-electron velocities, which allow them to work at higher switching speeds. Accordingly, WBG semiconductors are able to operate at relatively higher voltages and currents.

MOSFET 100 includes a first semiconductor layer 102 configured as a substrate for MOSFET 100. First semiconductor layer 102 is formed, in one embodiment, of an epitaxial layer of a mono-crystalline SiC semiconductor material of a of a first dopant type. In various embodiments, first semiconductor layer 102 is formed of other semiconductor materials. In the various embodiments described herein, a first dopant type of first semiconductor layer 102 is N-type, in which case the second, opposite dopant type, for example, P-Well 112 refers to P-type. Optionally, the first dopant type of first semiconductor layer 102 can be P-type, in which case the opposite dopant type is N-type. For simplicity, we describe the vertical power MOSFET structure in terms of an N-type substrate having a P-type body region. Examples of N-type dopant include, but are not limited to, Phosphorus and Nitrogen (in the case of SiC). In various embodiments, the implantation energy is in the range of 30-600 keV. Dopants of the P-type include boron or aluminum.

A surface 104 of first semiconductor layer 102 is oxidized using an oxidizing agent, for example, by heating in a furnace, forming an oxide layer 106 on surface 104. Layer 106 in most cases is a deposited oxide on the top of a thermally grown oxide. A hard mask layer 108 is deposited on oxide layer 106. In various embodiments, hard mask layer 108 is formed of a polysilicon or other material with oxidizing properties. A window 110 is formed in the hard mask layer 108 by, in some embodiments, by etching, for example, by dry or wet etching. Oxide layer 106 is etched using an acid, such as, hydrofluoric acid (HF) to expose surface 104 in a region of window 110. A body region or P-Well 112 is formed by ion implantation in the region of window 110. A spacer oxide layer 114 is formed self-aligned to hard mask layer 108, which acts as a spacer that offsets next implanted layers 116 and 117. Layers 116 and 117, which will form the source regions of MOSFET 100, are formed by ion implantation and have the opposite polarity in comparison to P-Well 112. A region 118 between a tip 120 of source region 116 and an end 122 of P-Well 112 is defined at least partially by the offset, and which includes a channel 124 is defined by a width 126 of spacer oxide layer 114. Similarly, on source region 117 side, a region 119 between a tip 121 of source region 117 and an end 123 of P-Well 112 is defined at least partially by the offset, and which includes a channel 125 defined by a width 127 of spacer oxide layer 114 on source region 117 side. As used herein, the offset illustrated in FIGS. 1-4 is referred to as a positive offset, with the meaning that the coverage area of P-Well 112 over the semiconductor is increased. Following the formation of spacer oxide layer 114, source region 116 and a heavily doped undamped inductive switching (UIS) region 128 are formed inside the semiconductor, at the defined/designed ion implantation depths. UIS region 128 of the second dopant type is positioned depth-wise in first semiconductor layer 102 beneath the source region 116 and vertically with them, inward from a channel region 130, to enhance a doping concentration of the body regions beneath source region 116 without affecting a gate threshold voltage. As used herein, gate threshold voltage, commonly abbreviated as Vth or VGS, refers to a minimum gate-to-source voltage differential that is needed to create a conducting path between source regions 116 and drain terminals.

FIGS. 5-8 illustrate a sequence of forming a vertical, double implanted, Metal Oxide Semiconductor Field Effect Transistor (MOSFET) 500 in accordance with another example embodiment of the present disclosure. In the example embodiment, MOSFET 500 is formed with a channel region 130 having an increased length 132 in a lateral direction 134. In the example embodiment, lengthening channel region 130 is accomplished by successively oxidizing hard mask layer 108, etching away the formed oxidation layer, ion implanting first semiconductor layer 102 under where the etched oxidation layer was to move P-Well 112, thus lengthening channel region 130. These steps can be repeated a predetermined number of times to lengthen channel region 130 to a desired dimension as described in detail below. Polysilicon material is selected for hard mask layer 108 because of its oxidation properties, which permits incrementally "walking" hard mask layer 108 back away from source regions 116 and 117, by first oxidizing a face 516 of hard mask layer 108 and then etching the oxidized face 516 away creating a new face 517 on hard mask layer 108. Although, polysilicon material is described herein, another material that is able to be oxidized and to function as described herein may be used. One selection criteria for an oxidizable material is its oxidation rate, which may be expressed in units of Angstroms per hour (Å/hr). A low oxidation rate will unnecessarily extend the oxide formation process, a high oxidation rate will affect the completeness of the oxidation process. In one embodiment, the oxidation rate is selected to be in the range of 60-20,000 Å/hr. In another embodiment, the oxidation rate is selected to be in the range of 1000-12,000 Å/hr. In still another embodiment, the oxidation rate is selected to be in the range of 1000-2000 Å/hr.

Figure 4:
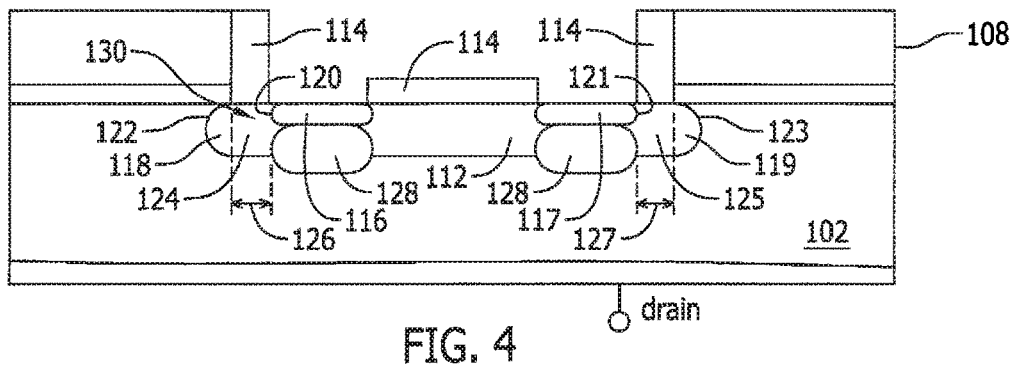
Figure 5:
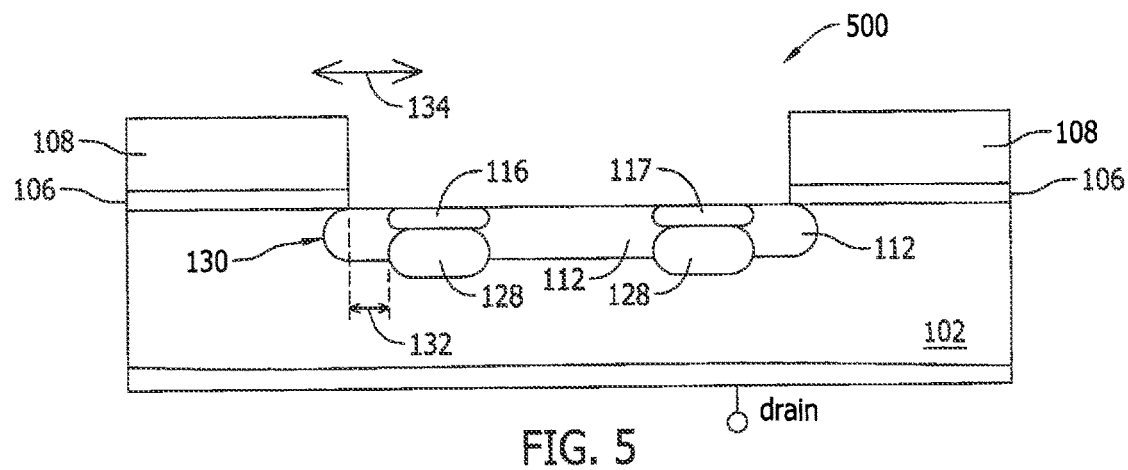
Figure 6:
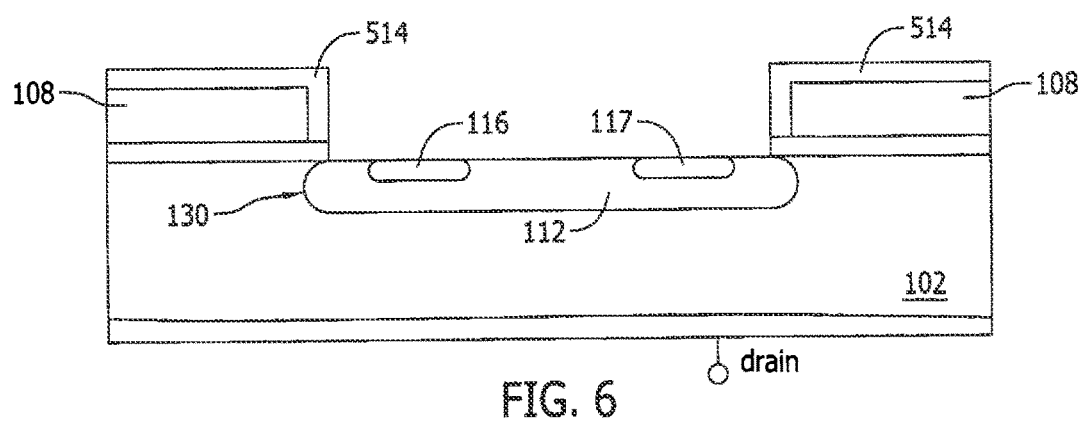
Figure 7:
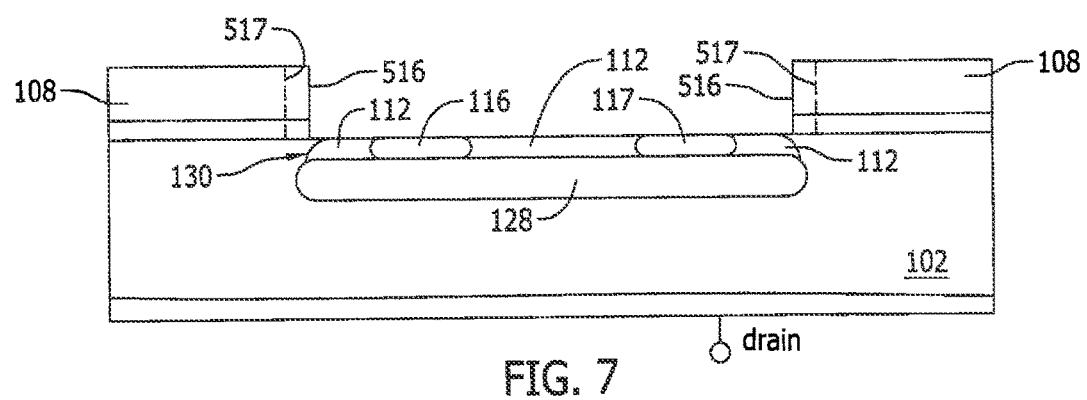
Figure 8:
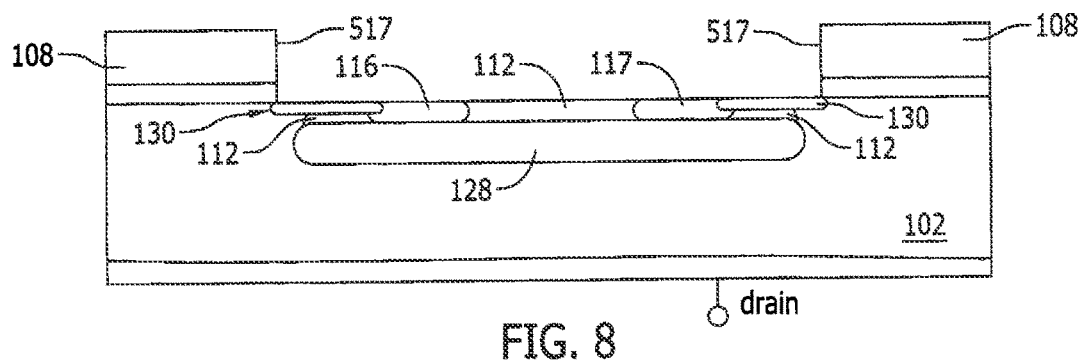

FIG. 5 illustrates MOSFET 500, which is similar to MOSFET 100 shown in FIG. 4, with spacer oxide layer 114 etched away. In the example embodiment, hard mask layer 108 is again oxidized forming a second oxide layer 514 (shown in FIG. 6), which is etched away again as shown in FIG. 7. Oxidizing hard mask layer 108 and etching the formed second oxide layer 514, moves face 516 laterally away from P-Well 112, permitting an addition of P-well material up to approximately a position of face 516. Additional steps of oxidizing hard mask layer 108, etching the formed oxide layer to expose more first semiconductor layer 102, and forming additional P-well material lengthens channel region 130, thus mitigating the "short channel effect." A channel of any length can thus be formed to accommodate various electrical requirements of MOSFET 500.

Figure 9:
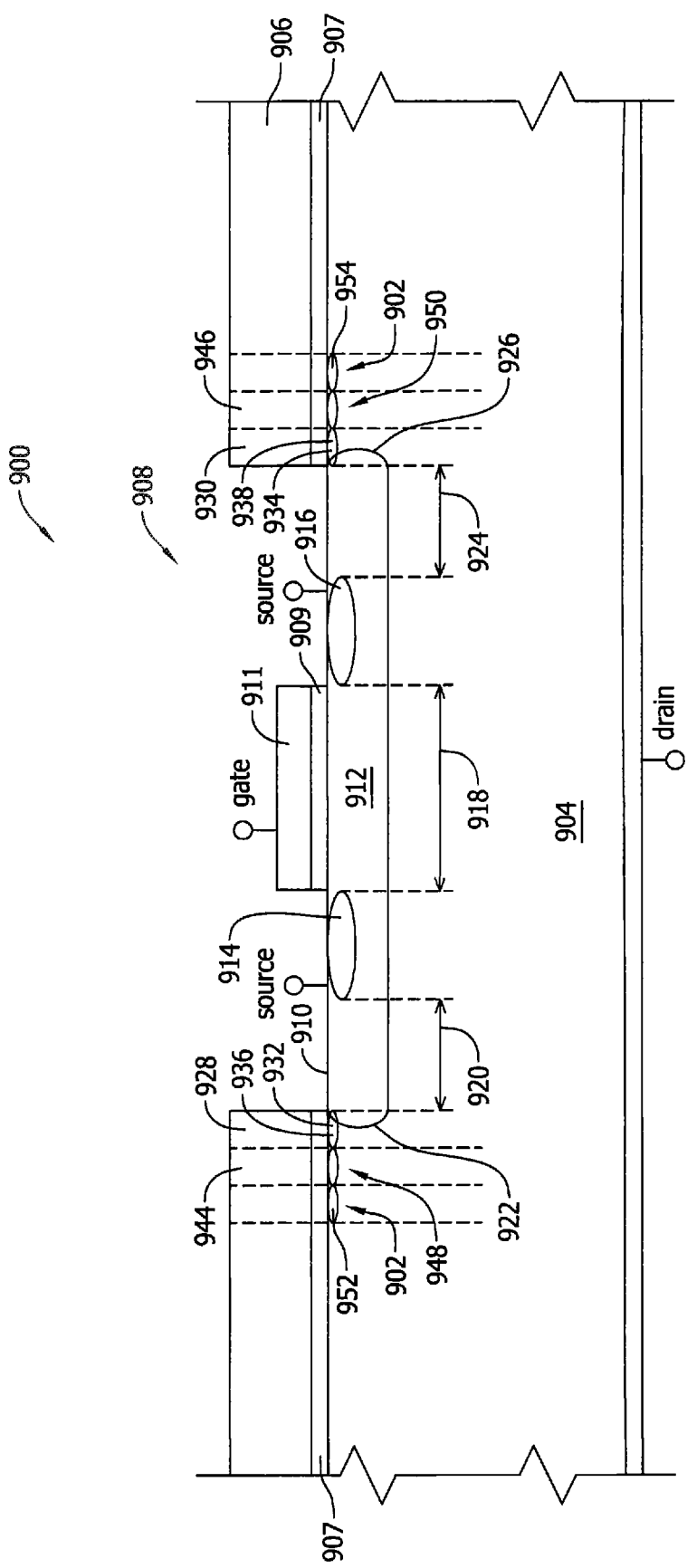

FIG. 9 is a cross-sectional view of a process of forming a power transistor assembly 900 having a plurality of channel extensions 902. In the example embodiment, power transistor assembly 900 is formed of a semiconductor substrate 904, such as, but not limited to silicon carbide (SiC). A hard mask layer 906 is formed on a layer of thin oxide 907 that is formed on or over semiconductor substrate 904 and a window 908 is etched in hard mask layer 906 and thin oxide layer 907 down to a surface 910 of semiconductor substrate 904. A gate region 911 is left in window 908. A body region 912 is formed in semiconductor substrate 904 at surface 910, in one embodiment, by ion implantation. A source region 914 is formed in body region 912. A source region 916 is formed in body region 912 spaced apart a distance 918 from source region 914.

As a result of such process, a first short channel 920 is formed in body region 912 between source region 914 and a first end 922 of body region 912. A second short channel 924 is formed in body region 912 between source region 916 and a second end 926 of body region 912. To mitigate short channel effects in power transistor assembly 900, body region 912 is extended laterally away from source region 914 and source region 916. To form plurality of channel extensions 902, a first region 928 and 930 of hard mask layer 906 is oxidized and then etched away leaving a first portion 932 and 934 of semiconductor substrate 904 exposed where first regions 928 and 930 were etched from. A first extension 936 and 938, respectively, are formed, for example, by ion implantation of first portions 932 and 934. First extensions 936 and 938 extend short channels 920 and 924 a distance equal to a width of first regions 928 and 930. Similarly, a second extension 940 and 942, respectively, is formed by oxidizing second regions 944 and 946 of hard mask layer 906, etching away oxidized second regions 944 and 946, and ion implanting second portions 948 and 950. Again, second extensions 940 and 942 extend short channels 920 and 924 an additional distance equal to a width of second regions 944 and 946. The procedure can be implemented a third time to form additional extensions 952 and 954, respectively, and additional extensions as needed.

Figure 10:
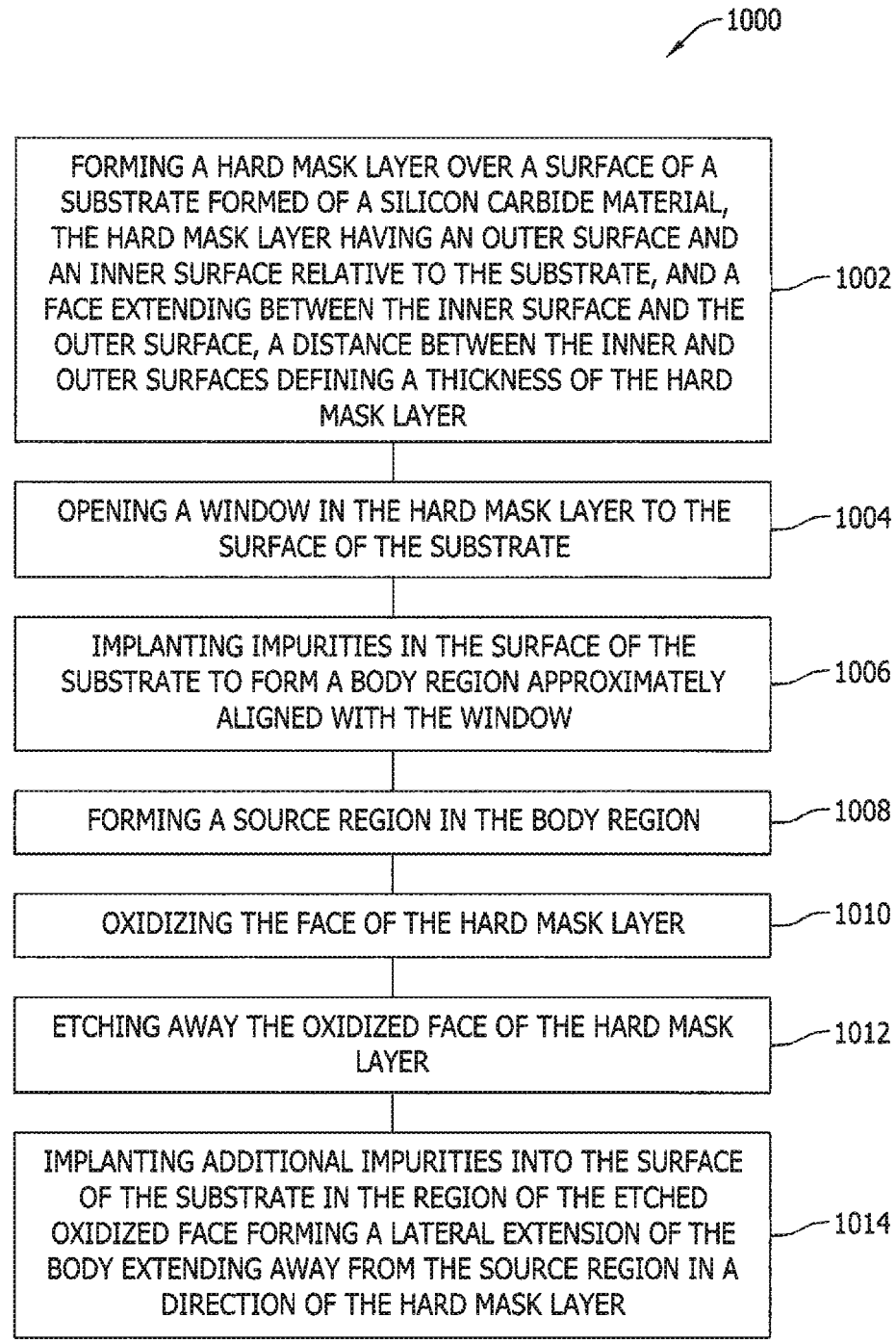

FIG. 10 is a flowchart of a method 1000 of mitigating short channel effects in a power transistor assembly in accordance with an example embodiment of the present disclosure. In the example embodiment, method 1000 includes forming 1002 a hard mask layer over a surface of a substrate formed of a silicon carbide material. In various embodiments, the hard mask layer includes an outer surface and an inner surface relative to the substrate, and a face extending between the inner surface and the outer surface. A distance between the inner and outer surfaces defines a thickness of the hard mask layer. Method 1000 also includes opening 1004 a window in the hard mask layer to the surface of the substrate, implanting 1006 impurities in the surface of the substrate to form a body region approximately aligned with the window, and forming 1008 a source region in the body region. Method 1000 further includes oxidizing 1010 the face of the hard mask layer, etching 1012 away the oxidized face of the hard mask layer, and implanting 1014 additional impurities into the surface of the substrate in the region of the etched oxidized face forming a lateral extension of the body extending away from the source region in a direction of the hard mask layer.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

The above-described embodiments of a power transistor assembly and method of fabricating the power transistor assembly provides a cost-effective and reliable means for mitigating short channel effects in silicon carbide DMOS-FET devices. More specifically, the assembly and method described herein facilitate increasing the channel length by oxidizing a portion of the hard mask layer covering the substrate and then by exposing additional substrate surface area by etching away the oxidized portion. The exposed substrate is then implanted with impurities to form extensions of areas forming the channel. Such process may be repeated a number of times to increase the length of the channel as desired. As a result, the assembly and method described herein facilitate electrically mitigating short channel effects in vertical DMOS type power transistors in a cost-effective and reliable manner.

Example assemblies and methods for mitigating short channel effects in power transistor devices are described above in detail. The apparatus illustrated is not limited to the specific embodiments described herein, but rather, components of each may be utilized independently and separately from other components described herein. Each system component can also be used in combination with other system components.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A power transistor assembly comprising:
a first layer of semiconductor material formed of a first conductivity type material;
a hard mask layer covering at least a portion of the first layer and having a window therethrough exposing a surface of said first layer;
a first region formed in said first layer of semiconductor material of a second conductivity type material and aligned with said window, said first region extending from said surface into said first layer a first depth;
one or more source regions formed of first conductivity type material within said first region; and
an extension of said first region extending laterally through said surface of said first layer, said extension of said first region extending from said surface into said first layer a second depth, the second depth being less than the first depth, wherein said extension of said first region comprises a plurality of serial extensions, each of said serial extensions formed separately from each other of said serial extensions.

2. The power transistor assembly of claim 1, wherein said first layer is an epitaxially formed substrate of silicon carbide (SiC).

3. The power transistor assembly of claim 1, wherein said hard mask layer comprises a layer of a polysilicon material.

4. The power transistor assembly of claim 3, wherein said hard mask layer comprises a thin oxide layer.

5. The power transistor assembly of claim 1, wherein said one or more source regions form a pn junction with the first region.

6. The power transistor assembly of claim 1, further comprising a drain region formed on a side of said first layer opposite said one or more source regions.

7. A method of mitigating short channel effects in a power transistor assembly, said method comprising:
- forming a hard mask layer over a first surface of a substrate formed of a silicon carbide material, the hard mask layer having an outer surface and an inner surface relative to the substrate, and a face extending between the inner surface and the outer surface, a distance between the inner surface and outer surface defining a thickness of the hard mask layer;
- opening a window through the hard mask layer to the first surface of the substrate;
- implanting impurities in the first surface of the substrate to form a body region approximately aligned with the window;
- forming a source region in the body region;
- oxidizing the face of the hard mask layer; etching away the oxidized face of the hard mask layer; and
- implanting additional impurities into the first surface of the substrate proximate the etched oxidized face forming a lateral extension of the body region extending away from the source region in a direction of the hard mask layer.

8. The method of claim 7, wherein forming a hard mask layer comprises forming a hard mask layer of a polysilicon material.

9. The method of claim 7, wherein forming a hard mask layer over a first surface of a substrate formed of a silicon carbide material comprises forming a hard mask layer over the first surface of the substrate formed of a first conductivity type silicon carbide material.

10. The method of claim 9, wherein implanting impurities in the first surface of the substrate to form a body region comprises implanting impurities in the first surface of the substrate having a second conductivity type silicon carbide material, the second conductivity type silicon carbide material being different than the first conductivity type silicon carbide material.

11. The method of claim 9, wherein forming a source region in the body region comprises implanting impurities in the first surface of the substrate having the first conductivity type silicon carbide material.

12. The method of claim 7, wherein forming a hard mask layer over a first surface of a substrate formed of a silicon carbide material comprises forming a relatively thin oxide layer over the first surface of the substrate and forming the hard mask layer over a surface of the relatively thin oxide layer.

13. The method of claim 7, further comprising forming a drain region on a second surface of the substrate opposite the hard mask layer.

14. A power semiconductor assembly comprising:
- a semiconductor substrate formed of an N-type material and having a first impurity concentration;
- a P-well formed on a first surface of the semiconductor substrate and having a second impurity concentration, the second impurity concentration greater than the first impurity concentration of the semiconductor substrate;
- an N-type source region formed on the first surface of the semiconductor substrate in the P-well and having a third impurity concentration that is greater than the first impurity concentration;
- at least one P-type extension region formed in the first surface of the semiconductor substrate and extending laterally away from the N-type source region, wherein the at least one P-type extension region comprises a plurality of serial extensions, each of the serial extensions formed separately from each other of the serial extensions; and
- a gate insulating film formed on the first surface of the semiconductor substrate, wherein the N-type source region includes a first N-type source region on one side of the gate insulating film and a second N-type source region on the opposite side of the gate insulating film.

15. The power semiconductor assembly of claim 14, further comprising a drain region on a second surface of the semiconductor substrate opposite said first surface.

* * * * *